United States Patent [19]

Kurtz et al.

[11] Patent Number: 4,476,366
[45] Date of Patent: Oct. 9, 1984

[54] CONTROLLED BONDING WIRE BALL FORMATION

[75] Inventors: John A. Kurtz, Gorham; Donald E. Cousens, Saco; Mark D. Dufour, Portland, all of Me.

[73] Assignee: Fairchild Camera & Instrument Corp., Mountain View, Calif.

[21] Appl. No.: 463,033

[22] Filed: Feb. 1, 1983

[51] Int. Cl.³ .............................................. B23K 31/00
[52] U.S. Cl. .............................. 219/56.22; 219/56.21; 219/113
[58] Field of Search .................. 219/56.1, 56.21, 56.22, 219/113, 137 R

[56] References Cited

U.S. PATENT DOCUMENTS 3,241,218  3/1966  Phillips .............................. 219/56.1
4,390,771  6/1983  Kurtz et al. ...................... 219/56.22

Primary Examiner—C. C. Shaw
Attorney, Agent, or Firm—Kenneth Olsen; Carl L. Silverman; Daniel H. Kane, Jr.

[57] ABSTRACT

Apparatus and method are described for rapid ball formation at the end of lead wire retained in the capillary wire holding tool of a ball bonding machine. A circuit is coupled between the cover gas shroud and lead wire for establishing controlled electrical discharge between the end of the bonding wire and the shroud, for melting and forming a ball. The circuit includes a DC power supply for delivering a positive polarity to the shroud and negative polarity to the lead wire for drawing a discharge of electrons from the end of the lead wire to the shroud. A capacitor is coupled in series with the DC power supply for receiving the electrical discharge. An impedance is also coupled in series for limiting the electrical discharge current. Charging of the capacitor limits and shapes the electrical arc discharge to a controlled pulse profile of short duration for rapid ball formation. An electronic gate is also used to control pulse duration. The rapid and controlled ball formation avoids necking or thinning of the lead wire which often occurs at the stem above the bonding ball.

28 Claims, 6 Drawing Figures

CONTROLLED BONDING WIRE BALL FORMATION

CROSS REFERENCE TO RELATED APPLICATIONS

This patent application is related to U.S. patent application, Ser. No. 262,595 filed May 11, 1981 entitled BONDING WIRE BALL FORMING METHOD AND APPARATUS, now U.S. Pat. No. 4,390,771 issued June 28, 1983; U.S. patent application, Ser. No. 294,411 filed Aug. 19, 1981 entitled LEAD FRAME WIRE BONDING BY PREHEATING; and U.S. patent application, Ser. No. 433,448 filed Oct. 8, 1982 entitled COVER GAS CONTROL OF BONDING BALL FORMATION; all said patent applications assigned to the assignee of the present invention.

TECHNICAL FIELD

This invention relates to a new method and apparatus for forming a ball at the end of bonding wire or lead wire extending from a capillary wire holding and bonding tool. Such ball formation has particular application for ball bonding of a lead wire to the die pad of an integrated circuit chip. The invention provides rapid and controlled delivery of energy for forming balls of uniform quality without "necking" or weakening, on lead wires of aluminum, copper, and other metals.

BACKGROUND ART

Bonding of lead wires to a microcircuit chip mounted on a lead frame for coupling to external circuitry is generally accomplished by ball bonding. According to this technique, a lead wire or bonding wire is held in a capillary tool so that the lead wire projects beyond the end of the tool. The capillary tool forms part of a ball bonding machine in which the tool is appropriately mounted and positioned over the metalized die pad of an integrated circuit chip. A ball is formed at the end of the lead wire or bonding wire by, for example, arc discharge between the bonding wire and another electrode. After solidification, the metal ball at the end of the lead wire is brought into intimate contact with the metalized die pad and a bond is formed typically by thermocompression or ultrasonic bonding.

Prior art methods of ball formation for bonding lead wires generally suffer from lack of control over the ball formation process with subsequent variation in the size, shape, overall strength and quality of the bonding ball. In particular, one of the problems associated with prior art methods of ball formation is the thinning and weakening of the lead wire which often occurs above the bonding ball. Such thinning and weakening of the lead wire at the stem adjacent to the ball is referred to as "necking" and presents the risk of failure or fracture of the lead wire at the ball bonding site. Further disadvantages of prior art ball bonding machines and methods are discussed in the "Background Art" section of U.S. Pat. No. 4,390,771 referred to above.

OBJECTS OF THE INVENTION

It is therefore an object of the present invention to provide further control over the ball formation process for providing bonding balls of uniform size, shape and quality without thinning or "necking" of the lead wire stem thereby reducing the risk of failure or fracture of the lead wire at the ball bonding site.

Another object of the invention is to provide a method of ball formation sufficiently rapid to avoid thinning, stressing, and necking of the lead wire stem. According to the invention, it has been determined that the speed of ball formation is a critical factor in avoidance of such defects.

A further object of the invention is to provide a new method and circuit for controlling, shaping and delivering an electrical pulse discharge for best melting and formation of a ball at the end of lead wire and bonding wire.

DISCLOSURE OF THE INVENTION

In order to accomplish these results the invention provides apparatus for rapid ball formation at the end of lead wire retained in the capillary wire holding tool of a ball bonding machine. The machine is of the type having a shroud mounted for positioning substantially around the end of the bonding wire or a portion of the end of the bonding wire for delivering cover gas over the end of the bonding wire. A circuit is coupled between the shroud and lead wire for establishing controlled electrical discharge between the end of the bonding wire and the shroud, for melting and forming a ball.

According to the invention, a DC power supply is operatively arranged in the circuit for delivering a positive polarity to the shroud for drawing a discharge of electrons from the end of the lead wire to the shroud. The lead wire thereby forms the cathode for electrical discharge in forming the ball. A feature and advantage of establishing the positive polarity at the shroud and the negative polarity or cathode at the lead wire is that the sharp end of the lead wire permits breakdown and ionization of the air or cover gas between the lead wire and shroud at lower voltage. Arc discharge can therefore be established more rapidly and with greater control. Furthermore, establishing the negative polarity or cathode at the smaller volume of the lead wire heats the wire quickly for more rapid ball formation. The invention also takes advantage of the fact that the cathode is generally the hotter electrode.

According to another feature of the invention a capacitor is coupled in series between the DC power supply and shroud for receiving electrical discharge between the end of the lead wire and the shroud. The charging of the capacitor during discharge from the lead wire to the shroud limits and shapes the electrical discharge to a controlled pulse profile of selected short duration. The use of this charging capacitor permits greater control over energy delivery by electrical discharge. Furthermore, the invention contemplates cooperative control or interaction between the capacitor and an impedance coupled in series with the power supply and capacitor for limiting the electrical discharge current charging the capacitor and operatively determining the time constant in cooperation with the capacitor. Thus, the pulse height or amplitude is determined by the high voltage power supply, typically 600–750 volts DC and the impedance. On the other hand, the pulse duration and profile are operatively determined by the size of the capacitor and the capacitance impedance coupling.

Additional control of the electrical discharge is provided by an electronic switch coupled in series between the capacitor and shroud for initiating and terminating electrical discharge across the lead wire and shroud to the capacitor. In the preferred embodiment, the electronic switch is a transistor gate controlling the relatively high voltage DC power supply. Additionally, a second trigger pulse transistor may be provided for controlling the conducting state of the high voltage transistor gate. The trigger pulse transistor is actuated by an initiating pulse. The trigger pulse transistor controls a relatively low voltage second power supply. An isolating coupling is provided between the relatively low voltage second power supply and the transistor gate controlling the relatively high voltage first power supply. The isolating coupling may be, for example, a transformer, optocoupler, etc.

The invention contemplates a variety of alternatives for the impedance coupled in the lead wire and shroud circuit. For example, the impedance may be in the form of a resistor or simple resistance which in combination with the capacitor determines the RC charging time constant. Alternatively, a series inductor may be used to provide inductive impedance for limiting current in the electrical discharge circuit. Generally a relatively low impedance is selected in the form of resistive impedance. Furthermore, the capacitance and resistance are selected so that the ball can be formed within one to two RC time constants at the prevailing high voltage power supply voltage of, for example, 600-750 volts DC.

Thus, according to the method for forming a ball at the end of bonding wire, the invention contemplates generating a controlled relatively high voltage electrical pulse of current for establishing arc discharge between the end of the lead wire and the shroud. This step involves applying a relatively high DC voltage establishing the positive polarity at the shroud and the negative polarity or cathode at the lead wire for drawing a discharge of electrons from the end of the bonding wire to the shroud through ionized cover gas. According to the invention, the step of discharging electrons between the lead wire and shroud electrodes also involves charging a capacitor with the pulse of current for shaping and limiting the pulse according to the capacitance of the capacitor.

Furthermore, the method provides for limiting the current amplitude of the pulse by impedance introduced in the circuit, and sharply terminating the pulse if desired using an electronic gate such as a transistor. An electrical pulse of controlled duration, amplitude and profile is thereby generated for rapid ball formation at the end of the lead wire. Necking of the lead wire at the bonding ball is avoided during ball formation.

A number of variations in the method are contemplated by the invention. Overall the timing of the ball formation is critical to prevent either necking of the lead wire or reaction of the ball metal with oxygen. In the preferred embodiment, the method is concerned with limiting the duration of ball formation by the controlled relatively high voltage pulse to a period in the range, for example, of 1 to 2.5 milliseconds. The critical parameters of capacitance of the capacitor and resistance of the impedance are selected so that, for example, two time constants of the charging capacitor are completed within the preferred specified duration for ball formation.

Other objects, features and advantages of the invention will become apparent in the following specification and accompanying drawings.

PRIOR ART STATEMENT

The closest prior art of which applicants are aware is the flame off power supply identified as Model No. 83-9461, also identified as the Dage Precima AB-10 "Aluminum Spark Ball System" available from Dage Precima International, of Colchester, United Kingdom. Such a system has been described in an article "Ultrasonic Ball/Wedge Bonding of Aluminum Wires" by C. J. Dawes, K. I. Johnson and M. H. Scott in the proceedings of the "European Hybrid Microelectronics Conference, 1979, Ghent". This article appears under the same title by C. J. Dawes and M. Weldl in the January 1979 issue of the *Welding Institute Research Bulletin*, Pages 9-14, Welding Institute, Abbington Hall, Abbington, Cambridge, England CB1 6AL. A disadvantage of these ball flame off power supplies is that they use capacitive discharge of a single irregular pulse for ball formation at the end of lead wire. The capacitor discharge generated arc results in considerable variation in the energy delivery to the end of the bonding wire for melting and ball formation. The Welding Institute system and method also uses an SCR which stays on until the capacitive discharge current falls to an extremely small holding level. Precise control is therefore not possible. The capacitor discharge further results in considerable variation in the ionization and arc formation between the wire and complementary shield electrode. The consequent variability of the pulse of energy may result in excessive or defective energy delivered to the end of the wire with resulting inferiority in the bonding ball quality. This capacitor discharge method has also been incorporated on the Kulicke and Soffa Industries, Inc., Model No. 472 Ball Bonding Machine.

On the other hand, according to the present invention, arc discharge between the lead wire and shroud electrodes is not accomplished by capacitive discharge. Rather, the charging of a capacitor is utilized affording greater control over the duration and profile of the pulse. According to the invention, a DC power supply of relatively high voltage is applied in the lead wire and shield circuit so that the positive polarity is established at the shield while the negative polarity or cathode is established is at the lead wire. This polarity is the opposite of the polarity used in the identified prior art methods and devices. This opposite polarity, first conceived and incorporated by the present invention, achieves considerable advantages discussed above including more rapid and effective ionization of the cover gas and better heating of the lead wire.

Furthermore, the present invention contemplates and provides precise electronic control overall in the initiation and termination of the electric discharge pulse by the use of a transistor gate which can positively initiate and positively terminate the pulse if desired. Pulse control is also achieved within desired limits by controlling the pulse profile and duration by the combination of capacitance and impedance parameters selected. Greater control over the pulse is achieved by charging the capacitor rather than by capacitive discharge.

BRIEF FIGURE DESCRIPTION

DETAILED DESCRIPTION OF PREFERRED EXAMPLE EMBODIMENTS AND BEST MODE FOR CARRYING OUT THE INVENTION

Figure 1:
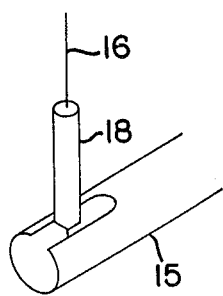
FIG. 1 is a simplified perspective view of the lead wire and shroud electrodes arranged for incorporation in the ball bonding circuit of the present invention with the lead wire retained in a capillary wire holding tool.
Figure 2:
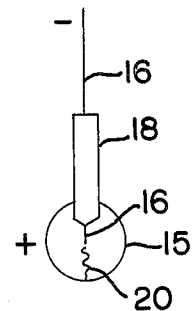
FIG. 2 is a front plan view of the juxtaposition of the lead wire and shroud electrodes with an illustrative diagrammatic arc discharge shown between the electrodes.

Apparatus according to the present invention for rapid ball formation, may use a stock ball bonding machine such as the K&S Model 478 manufactured by Kulicke & Soffa Industries, Inc., modified in accordance with the invention. As shown in FIGS. 1 and 2, the ball bonding machine is provided with a shroud 15 extendable for at least partially enclosing or surrounding the end of the lead wire 16 which is in turn held by the capillary wire holding tool 18 of the ball bonding machine. The lead wire 16 and shroud 15 form electrodes in the ball formation circuit of the present invention. This power supply circuit generates an electric arc discharge 20 between the end of the lead wire 16 and shroud 15 for melting and forming a ball at the end of the lead wire, all as hereafter described. The shroud of course also performs the function of delivering a cover gas over the end of the lead wire during the ball formation. Further information and details on the manner of mechanically and electrically retrofitting the stock ball bonding machine to provide the shroud are found in the related patent applications cross-referenced above.

Figure 3:
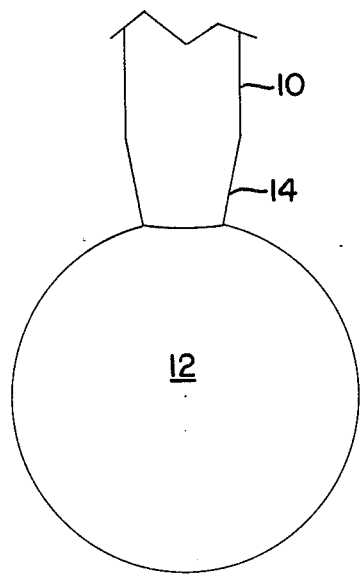
FIG. 3 is a side plan view of a lead wire and bonding ball formed at the end of the lead wire with undesirable necking at the stem above the ball.

When the electric arc discharge 20 for ball formation at the end of lead wire 16 is generated by capacitive discharge, for example as taught by the prior art references cited above, a weakened lead wire joint may result in the manner shown in FIG. 3. Thus, if sufficient control is not exercised over energy delivery during formation of ball 12 at the end lead wire 10, a thinning or necking may occur at the stem 14 of lead wire 10 just above the melted ball 12. The stem 14 is a location of particular stress for the lead wire. As a result of the necking or thinning, the lead wire tends to bend more easily and may eventually fail at the stem junction with ball 12. The free lead wire 10 may then short out against the side of the die which is grounded. The weakened stem 14 may also fail or part during encapsulation or potting of the integrated circuit device.

Figure 4:
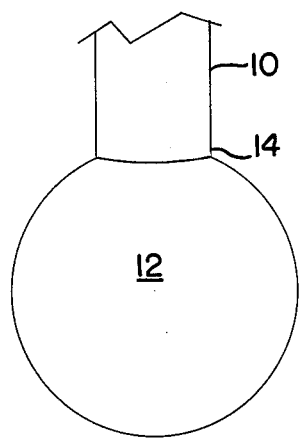
FIG. 4 is a plan view from the side of a high quality bonding ball formation at the end of a lead wire without undesirable necking at the stem.
Figure 5:
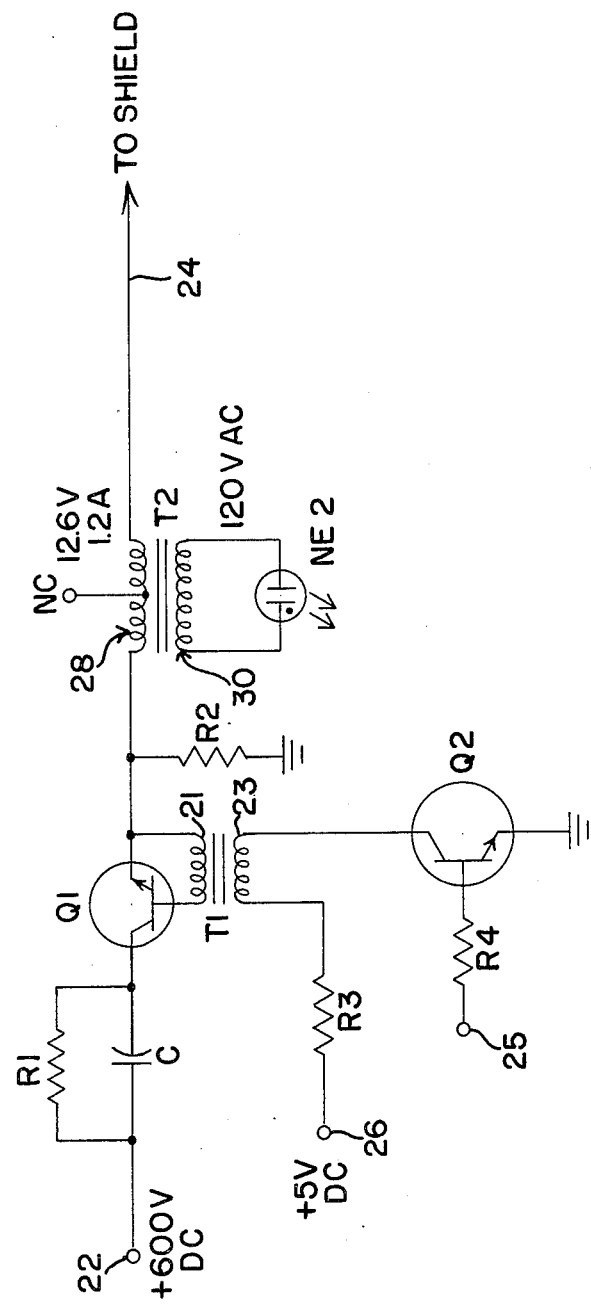
FIG. 5 is a schematic circuit diagram of a control circuit according to the present invention for controlling electrical arc discharge in the ball bonding circuit which includes the lead wire and shroud electrodes.
Figure 6:
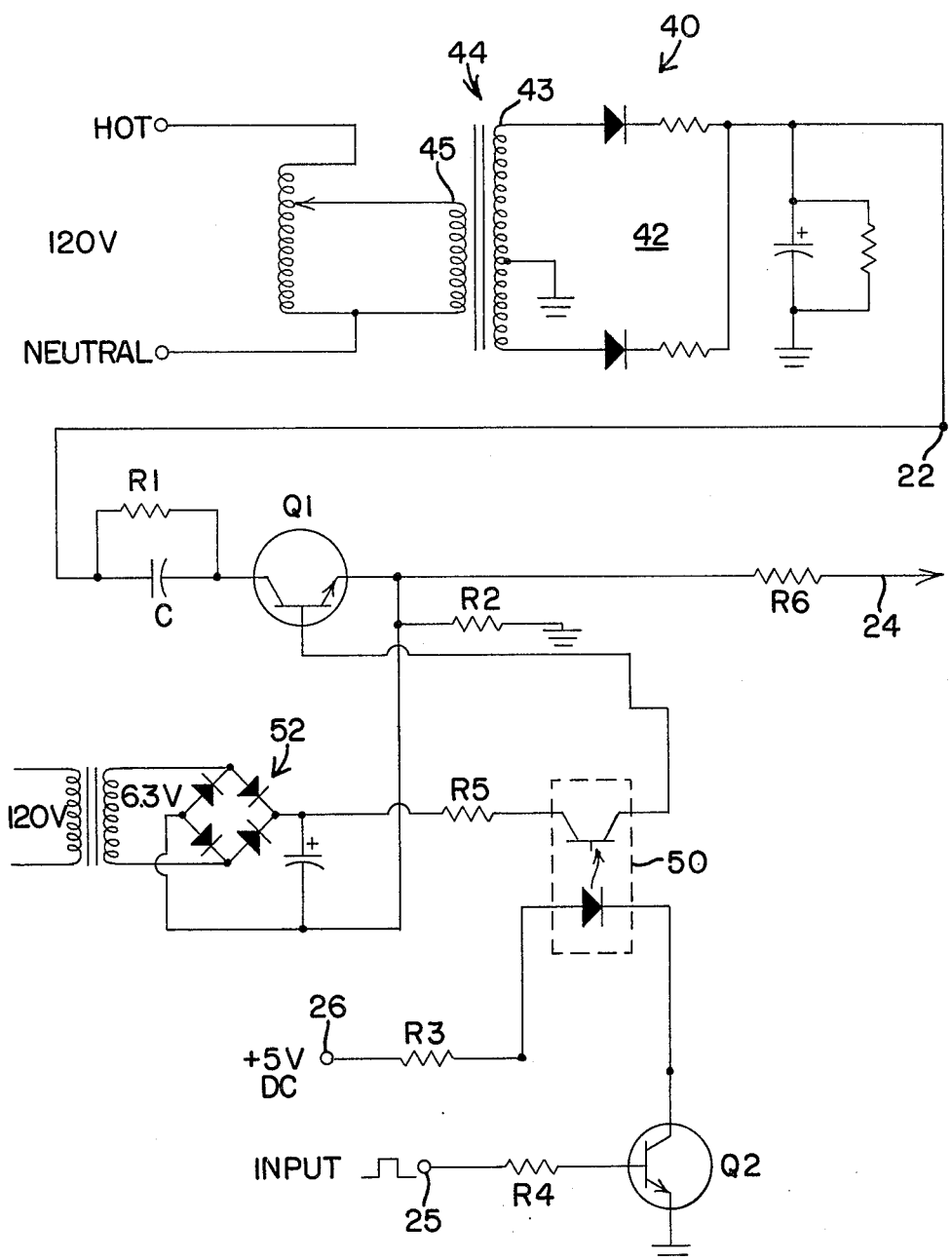
FIG. 6 is a schematic circuit diagram of yet another control circuit according to the invention for controlling electrical arc discharge in the ball bonding lead wire and shield electrode circuit.

As hereafter described, the apparatus for ball formation according to the present invention and in particular the circuits of FIGS. 5 and 6 provide a strong joint without necking or thinning at the stem 14 of lead wire 10 in the manner shown in FIG. 4.

A circuit for achieving controlled electrical discharge between the lead wire and shroud and for uniform quality ball formation is illustrated in FIG. 5. This circuit for generation of the controlled pulse includes a source of relatively high voltage DC, for example, a 600 to 750 volt DC source not shown but applied at the terminal 22. The polarity is arranged so that the positive pole of a 600 volt DC source is applied to terminal 22 and through additional components of the circuit to the shield or shroud, also referred to as the flame-off shield or shroud. The directional arrow line 24 of the circuit is directed to this shroud and electrically coupled to apply the positive polarity to the shroud. In the operation of the circuit, a single trigger pulse is applied to terminal 25 at the base of trigger pulse transistor Q2 through the limiting resistor R4 having a value of, for example, 1K ohms. Trigger pulse transistor Q2 becomes conducting for the relatively low voltage power supply source of, for example, 5 volts DC applied at terminal 26. With trigger pulse transistor Q2 conducting the collector to emitter current passes through the collector resistor R3 and the primary 23 of transformer T1. Transformer T1 is, for example, a small audio transformer which isolates the low voltage DC power supply at terminal 26 from the relatively high voltage DC power supply applied to terminal 22.

Thus, as a result of application of a trigger pulse at terminal 25, Q2 conducts a pulse of relatively low voltage current through transformer primary 23 inducing a current in the secondary 21 of transformer T1 connected to the base of transistor gate Q1. Transistor gate Q1 begins to conduct and current is drawn from ground to begin charging capacitor C. Thus, current will conduct from ground through the bonding wire, through the cover gases in the flame-off shroud by way of electric arc discharge to the shroud, then through line 24 and the series inductor 28 comprising the secondary of transformer T2, then through transistor gate Q1 now conducting for a controlled pulse duration, and into the capacitor C. The charging current will vary exponentially with time in accordance with well known laws relating to the charging of capacitors.

The rapid current surge having a duration and profile controlled at least in the first instance by capacitor C is sufficient to melt a ball of, for example, 2.5 to 3 mils in diameter at the end of the 1 mil diameter lead wire. The series inductor 28 limits the current surge to a value where a good quality ball is formed and below the point where the lead wire will melt in an unwanted place, for example, at the neck above the ball. The neon lamp NE2 on the primary winding 30 of transformer T2 will flash when the ball forming pulse current or "flame-off" current occurs.

According to the invention, the flame-off or ball forming current pulse stops when the capacitor C becomes fully charged. A second simultaneously operating control is provided by transistor gate Q1. The flame-off or ball forming current pulse will be terminated when transistor Q1 turns off. Thus, the ball forming pulse is truncated when either Q1 turns off or the capacitor C becomes fully charged. Using the parameters hereafter selected by way example, the latter usually occurs first. With respect to other details of the circuit, resistor R1 is a bleeder resistor which discharges capacitor C between ball forming steps. Upon initiation of a trigger pulse at terminal 25 and the sequence of circuit events described above, capacitor C has previously been fully discharged by the bleeder resistor R1. Transistor gate Q1 may be replaced with a silicon controlled rectifier, however, in accordance with the preferred embodiment of the present invention, transistor gate Q1 affords the gating opportunity not only for initiating the pulse but also truncating or terminating the pulse electronically. Transistor gate Q1 may be affirmatively turned off while an SCR cannot. Transistor Q1 may be, for example, an SK 3115 transistor. The transformer T2 may be, for example, a 120 volt AC primary, 12.6 volts 1.2 amps secondary.

A more elaborate circuit for control of ball formation according to the invention is illustrated in FIG. 6. The components of this circuit performing the same function as in the circuit of FIG. 5 are similarly designated. For example, transistor gate Q1 controls the flow of the pulse of current through line 24 to capacitor C. Bleeder resistor R1 assures that capacitor C is discharged at the beginning of each ball formation step. In the circuit of FIG. 6, the relatively high voltage first power supply is shown coupled to terminal 22. In this example, the relatively high voltage, for example, 600 volts DC output, power supply 40 is provided by a full wave rectifier 42 at the secondary 43 of transformer 44. The primary 45 of transformer 44 is connected to the conventional 120 volt AC power supply. As previously described with reference to FIG. 5, when gate transistor Q1 is conducting, a pulse of current is drawn of ground through the lead wire and by way of arc discharge across the ionized cover gas to the shroud, then via line 24 through an impedance which in this instance is a pure resistance R6 rather than the inductor or inductive impedance of FIG. 5. The current continues through gate transistor Q1 then conducting to fill or charge capacitor C. The time constant for the charging of capacitor C is of course a function of the R6C system. Capacitor C is selected to have, for example, a capacitance of 0.44 μF. The resistance of the resistor R6 is selected, for example, in the range of 1K to 2.5K ohms, so that approximately 2 to 3 time constant periods are completed within a time duration of, for example, from less than 1 to 2 milliseconds so that the pulse period or pulse duration is substantially completed within that time. Examples are described below.

The circuit of FIG. 6 incorporates a different arrangement for control of transistor gate Q1. In this example, a high speed isolating coupling is used for controlling the gate transistor Q1 from a relatively low voltage second power supply source. More specifically, a trigger pulse applied at terminal 25 through resistor R4 at the base of Q2 drives transistor Q2 to the conducting state for the duration of the trigger pulse. During the period that transistor Q2 is conducting through its collector to emitter circuit, a low voltage DC source, for example, 5 volts DC applied at terminal 26 as heretofore described with reference to FIG. 5 actuates the light emitting diode of optocoupler 50. Optocoupler 50 then becomes conducting through its phototransistor permitting the low voltage biasing power supply 52 to drive the transistor gate Q1. Low voltage biasing power supply 52 comprises a full wave bridge rectifier at the secondary of a transformer coupled to the conventional 120 volt AC power supply. The low voltage biasing power supply current is delivered through current limiting resistor R5 and the phototransistor of optocoupler 50 to the base of transistor gate Q1.

In application of the control circuit to ball formation according to the invention on aluminum bonding wire, the ball formation time is even more critical because of the reactivity of aluminum. In the following examples, a relatively high voltage first power supply 40 of 600 volts DC was used. The low voltage biasing power supply 52 delivered 6.3 volts DC. In each of the following examples the charging capacitor C was selected to have a capacitance of 0.44 μF with a bleeding resistor R1 of 1 Meg. In example 1, the current limiting resistor R6 was selected to have a resistance of 1500 ohms (1.5K). Upon initiation of a trigger pulse at input terminal 25 a good quality ball of the type illustrated in FIG. 4 was formed with a pulse duration of approximately 1.49 milliseconds.

In example 2, the inductor 28 of FIG. 5 was used for current limiting impedance instead of using resistor R6. Using the 12.6 volt 1.2 amp secondary of a transformer with 120 volt AC primary as current limiting inductor, a good quality ball was also formed of size approximately 2.5 mil diameter with clean spherical surface from a pulse having duration of less than 1 and as little as 0.24 milliseconds. A 50 khz (50,000 cps) ringing was noted in the inductor capacitor charging circuit.

On the other hand in example 3, a 25K ohm series charging resistor R6 was used for impedance. This slowed the pulse duration to an extent producing an unacceptable quality ball of erratic shape, rough surface and necking at the lead wire stem above the ball. In example 4 the charging resistor R6 was reduced to 2.5K ohms with the result that a fair quality ball, spherical, and smoother was produced, however with slight necking problems.

It is apparent, according to the present invention, that impedance control and current limitation at the time of capacitor charging is critical. The impedance must be selected so that the RC time constant of the resistance capacitance system or more generally, the impedance capacitance system of the charging circuit for capacitor C is in the order of magnitude of a millisecond or less. The charging of capacitor C is therefore substantially complete within approximately from less than 1 to 3 milliseconds or 2 to 3 times the time constant of the RC system. If the selected impedance is too great, ball formation is delayed resulting in balls of lower quality or unacceptable quality. If the selected impedance is too small, there is insufficient control over the arc discharge current. Thus, the RC system must be selected to permit charging of the capacitor within, for example, 2 to 3 time constants of the RC system selected so that the process may be completed and the electric pulse discharge limited to a duration in the range of approximately one millisecond or less or more generally from less than 1 to 3 milliseconds and preferably from less than 1 to 2 milliseconds.

The use of capacitance charging in accordance with the present invention to control the pulse profile of electrical arc discharge affords advantageous conditions for ball formation. The controlled profile wave form delivers higher initial energy for fast melting at the leading edge of the pulse. The pulse profile then tapers delivering lower energy so that the initial melting of the ball is followed by cooling which avoids necking at the stem of the lead wire where it joins the newly formed ball. Thus, the capacitor C functions as an electric current control valve and shapes the current for best melting and formation of the ball without necking.

While the invention has been described with reference to particularly example embodiments, it will be apparent that it is intended to cover all variations and equivalents within the scope of the following claims.

We claim:

1. Apparatus for rapid bonding ball formation at the end of lead wire retained in the capillary wire holding tool of a ball bonding machine, said machine having shroud means mounted for positioning substantially around the end of the lead wire for delivering cover gas over the end of the lead wire, said apparatus including circuit means coupled between the shroud means and lead wire for establishing a controlled electrical arc and current pulse between the end of the lead wire and the shroud means for melting and forming a bonding ball, comprising:

DC power supply means operatively arranged and coupled for delivering a positive polarity to the shroud means and a negative or ground polarity to the lead wire for drawing an arc of electrons from the end of the lead wire to the shroud means, said lead wire thereby comprising the cathode for said electrical arc;

capacitor means coupled in series with said DC power supply means and said shroud means for receiving current from the electrical arc between the end of the lead wire and shroud means and for charging of said capacitor means during the electrical arc thereby limiting and shaping said electrical arc to a current pulse of controlled profile and short duration;

electronic switch means coupled in series with said capacitor means and said shroud means for initiating and terminating said electrical arc across the lead wire and shroud means thereby further controlling the duration of said current pulse charging the capacitor means;

and impedance means coupled in series with said DC power supply means, capacitor means, and electronic switch means for limiting the current of said electrical arc and current pulse charging said capacitor means thereby controlling the amplitude of said current pulse;

whereby a controlled electrical arc and current pulse passes between the lead wire and shroud means for rapidly melting and forming a bonding ball of specified size without necking of the lead wire above said bonding ball.

2. The apparatus of claim 1 wherein said circuit means further comprises bleeder resistor means coupled in parallel with said capacitor means and arranged in said circuit means for discharging said capacitor means after the bonding ball is formed and the capacitor is charged.

3. The apparatus of claim 1 wherein said DC power supply means comprises relatively high voltage first power supply means and wherein said electronic switch means comprises transistor gate means controlling said relatively high voltage means.

4. The apparatus of claim 3 wherein said electronic switch means further comprises trigger pulse transistor means operatively coupled for controlling the conducting state of the transistor gate means upon actuation of said trigger pulse transistor means;

isolating coupling means coupling the trigger pulse transistor means to said transistor gate means for controlling the conducting state of said transistor gate means;

relatively low voltage second power supply means operatively coupled and controlled by said trigger pulse transistor means for controlling the conducting state of the transistor gate means, said isolating coupling means isolating the relatively high voltage first power supply means from said relatively low voltage second power supply means.

5. The apparatus of claim 4 wherein said isolating coupling means comprises transformer means.

6. The apparatus of claim 4 wherein said isolating coupling means comprises optocoupler means.

7. The apparatus of claim 1 wherein said impedance means comprises resistor means.

8. The apparatus of claim 7 wherein the relatively high voltage first power supply means comprises voltage in the range up to approximately 750 volts DC.

9. The circuit of claim 8 wherein said resistor means is selected to have a resistance in the range of 1K to 2.5K ohms, and said capacitor means is selected to have capacitance in the range of approximately 0.44 $\mu$F.

10. The circuit of claim 1 wherein said impedance means comprises inductance means coupled in series with said power supply means, capacitor means, and electronic switch means.

11. The circuit of claim 1 wherein said DC power supply means comprises a first relatively high voltage power supply, wherein said electronic switch means comprises first transistor means controlling the circuit from said shroud means to the capacitor means, and further comprising second transistor means operatively coupled for controlling the conducting state of the first transistor means, second relatively low voltage power supply coupled in series with said second transistor means for driving the base of the first transistor means when the second transistor means is conducting, and voltage isolating coupling means coupling said second transistor means to the first transistor means.

12. The circuit of claim 11 wherein said voltage isolating coupling means comprises a transformer.

13. The circuit of claim 11 wherein said voltage isolating coupling means comprises an optocoupler.

14. The circuit of claim 11 wherein said first relatively high voltage power supply comprises voltage in the range of 600–750 volts DC.

15. Apparatus for forming a bonding ball at the end of bonding wire retained in a capillary wire holding tool of a ball bonding machine including shroud means for positioning substantially around the end of the bonding wire and for delivering cover gas over the end of the bonding wire, said apparatus comprising:

circuit means for generating and delivering a short controlled electrical pulse establishing an arc between the end of the bonding wire and the shroud means for melting and forming a bonding ball at the end of the bonding wire, said circuit means comprising DC power supply means having positive polarity coupled to the shroud means and negative or ground polarity coupled to the bonding wire for drawing an arc of electrons from the end of the bonding wire to the shroud means, capacitor means coupled in series with said DC power supply means and shroud means for charging of said capacitor means during the arc and thereby shaping and limiting the arc to an electrical pulse of specified pulse profile and duration, electronic gate means coupled in series with said capacitor means for initiating and terminating the electrical pulse and arc charging said capacitor means, and impedance means coupled in series with said capacitor means and electronic gate means for limiting the current of said electrical pulse and arc;

said capacitor means and impedance means selected to yield a time constant for charging of said capacitor means which limits the electrical pulse and arc to a specified duration and a specified amplitude whereby necking of the bonding wire adjacent to the bonding ball is substantially eliminated.

16. The apparatus of claim 15 wherein said capacitor means value C and impedance means value R are selected to afford a pulse duration of 2 to 3 times the RC time constant and less than 2 milliseconds.

17. The apparatus of claim 16 wherein said values R&C are selected to afford a pulse duration substantially in the order of 1 millisecond or less.

18. A method for rapidly forming a bonding ball at the end of lead wire retained in the capillary wire holding tool of a ball bonding machine, said machine having shroud means mounted for positioning substantially around the end of the lead wire for delivering cover gas over the end of the lead wire comprising:
  applying a positive polarity relatively high DC voltage to the shroud means and a corresponding negative or ground polarity to the lead wire and drawing an arc of electrons from the end of the lead wire to the shroud means thereby initiating a charging current;
  charging a capacitor with said charging current thereby limiting the duration of said charging current to a current pulse upon completion of charging of the capacitor means and thereby controlling the profile of the current pulse;
  further limiting the amplitude of said current pulse by impedance means;
  selecting said capacitor means and impedance means to yield a time constant for controlling the current pulse according to the desired range of duration and amplitude;
  and initiating said current pulse by electronic gating means.

19. The method of claim 28 wherein said step of initiating the relatively high DC voltage current pulse by said electronic gating means comprises controlling said gating means by a relatively low DC voltage.

20. The method of claim 19 further comprising the step of electrically isolating and decoupling the relatively low DC voltage from the relatively high DC voltage.

21. The method of claim 20 comprising the step of limiting the duration of said relatively high DC voltage current pulse to approximately the range of 1–2 milliseconds.

22. A method for forming a bonding ball at the end of lead wire held in the capillary wire holding tool of a ball bonding machine including a movable shroud or shield for substantially enclosing the end of the lead wire in the shroud for flooding the end of the lead wire with a cover gas during bonding ball formation comprising:
  coupling and applying the positive polarity of a relatively high DC voltage to the shroud while coupling and applying the corresponding negative or ground polarity of the relatively high DC voltage to the lead wire thereby constituting the lead wire a cathode in an electrical arc circuit and drawing an arc of electrons from the tip of the lead wire to the shroud for initiating a charging current;
  coupling a capacitor in series between the relatively high DC voltage and the shroud and charging the capacitor with said charging current thereby limiting the duration of the arc and charging current to a current pulse upon completion of charging of the capacitor and thereby controlling the profile of the current pulse;
  limiting the amplitude of said current pulse by interposing an impedance in the arc circuit;
  selecting the values of the capacitor and impedance to provide a time constant for controlling the current pulse duration and amplitude within selected ranges for rapidly melting and forming a bonding ball at the tip of the lead wire without necking of the lead wire of the bonding ball;
  initiating and terminating the arc and charging current by first electronic gating means operating at relatively high voltage thereby further controlling the duration of the current pulse charging the capacitor;
  controlling the conducting state of the first electronic gating means by second electronic gating means operating at relatively low voltage;
  and coupling the second electronic gating means and first electronic gating means through a voltage isolating coupling thereby isolating and decoupling the relatively low voltage from the relatively high voltage.

23. The method of claim 22 further comprising the step of limiting the duration of the current pulse to a period in the range of less than 2 milliseconds.

24. The method of claim 23 wherein the step of coupling and applying the positive polarity of a relatively high DC voltage to the shroud comprises coupling and applying a relatively high DC voltage in the range of 600–750 volts DC.

25. The method of claim 24 wherein the step of selecting the value of the capacitor and impedance comprises selecting the impedance to have a resistance in the range of 1K to 2.5K ohms.

26. The method of claim 25 wherein the step of selecting the value of the capacitor and impedance comprises selecting the capacitor to have a capacitance in the range of approximately 0.44 $\mu F$.

27. The method of claim 24 wherein said impedance comprises an inductance.

28. The method of claim 23 comprising the step of selecting the value of the capacitor and impedance to afford a pulse duration approximately in the range of 1 to 3 times the time constant afforded by the selected capacitor and impedance.

* * * * *